United States Patent [19]

Amano et al.

[11] Patent Number: 4,908,940
[45] Date of Patent: Mar. 20, 1990

[54] METHOD OF MANUFACTURING TWO-LAYER PRINTED CIRCUIT SHEET

[75] Inventors: Toshiaki Amano; Tomoya Kato, both of Hiratsuka; Kenzo Kobayashi, Ichihara; Yoshihiro Onuma, Aizuwakamatsu, all of Japan

[73] Assignee: The Furukawa Electric Co., Ltd., Tokyo, Japan

[21] Appl. No.: 283,229

[22] Filed: Dec. 12, 1988

[30] Foreign Application Priority Data

Jun. 22, 1987 [JP] Japan .................. 62-153531

[51] Int. Cl.⁴ .............................................. H01K 3/10
[52] U.S. Cl. ...................... 29/852; 174/262; 427/97; 428/901
[58] Field of Search ............. 29/852, 857, 860, 863, 29/864; 174/68.5; 427/97; 428/901

[56] References Cited

U.S. PATENT DOCUMENTS

| | | | |
|---|---|---|---|
| 3,077,511 | 2/1963 | Bohrer et al. | 179/68.5 |
| 4,024,629 | 5/1977 | LeMoine et al. | 427/97 X |
| 4,249,302 | 2/1981 | Crepeau | 427/97 X |
| 4,604,160 | 8/1986 | Murakami et al. | 174/68.5 X |
| 4,663,497 | 5/1987 | Reimann | 427/97 X |
| 4,792,646 | 12/1988 | Enomoto | 29/852 |

FOREIGN PATENT DOCUMENTS 60-121791  6/1985  Japan .

Primary Examiner—Carl J. Arbes
Attorney, Agent, or Firm—Frishauf, Holtz, Goodman & Woodward

[57] ABSTRACT

An insulating sheet having through holes formed therein at positions where circuit patterns formed on its both surfaces are electrically connected is prepared. A sheet for forming a hole bottom is attached to one surface of the insulating sheet. Subsequently, a first-layer circuit pattern is printed on the other surface of the insulating sheet to which the hole-bottom sheet is not attached, and a conductive paste is filled into the holes. Thereafter, the hole-bottom sheet is removed. Then, a second-layer circuit pattern is printed on the surface of the insulating sheet, from which the hole-bottom sheet is removed. With this process, a two-layer printed circuit sheet is manufactured.

9 Claims, 4 Drawing Sheets

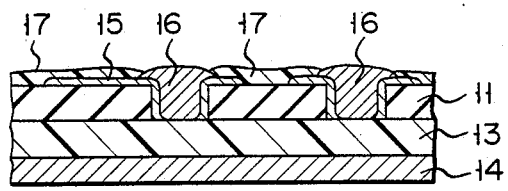
F I G. 1E
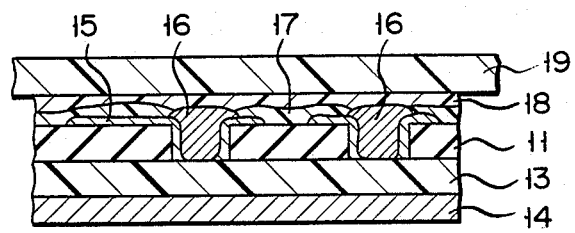
F I G. 1F
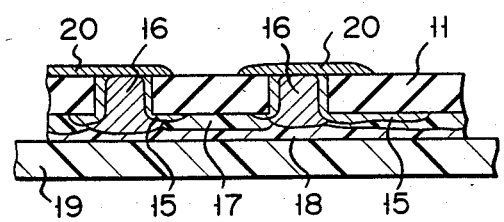
F I G. 1G
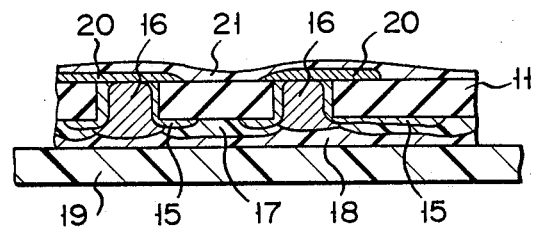
F I G. 1H

F I G. 2A
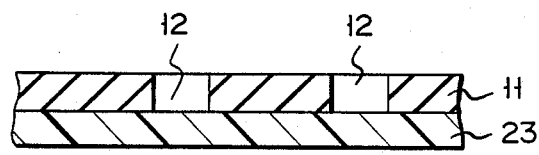
F I G. 2B
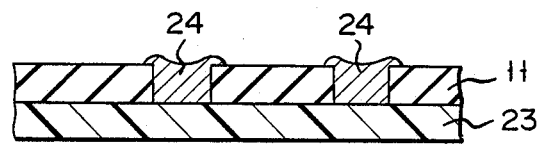
F I G. 2C
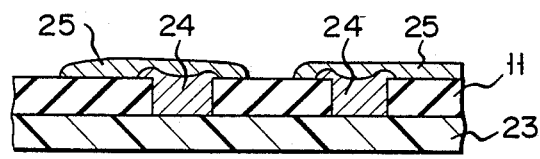
F I G. 2D

METHOD OF MANUFACTURING TWO-LAYER PRINTED CIRCUIT SHEET

BACKGROUND OF THE INVENTION

1. Field of the Invention

The present invention relates to a method of manufacturing a printed circuit sheet having a two-layer circuit pattern.

2. Description of the Related Art

According to a known conventional method of manufacturing a printed circuit sheet (Japanese Patent Disclosure (Kokai) No. 60-121791), a circuit pattern transfer sheet is placed in an injection molding die, and a circuit pattern is integrally formed on a required surface of an injection-molded body simultaneously with injection molding. The circuit pattern transfer sheet in this method is obtained by printing a circuit pattern on a releasable base sheet by using a conductive paste, and forming an adhesive layer for adhesion with the injection-molded body thereon. In this method, a circuit pattern is formed in a single layer.

As a circuit structure becomes complex, circuit patterns must be formed in two layers. When circuit patterns are to be printed in two layers by using a conductive paste, the following method is employed. A first-layer circuit pattern is printed on a base sheet using a conductive paste, thereafter an insulating layer consisting of an insulating paste, and through studs (for electrically connecting circuit patterns of two layers to each other) are printed overlapping the first-layer circuit pattern. Then, a second-layer circuit pattern is printed on the resultant structure by using a conductive paste.

According to such a manufacturing method, however, since an insulating layer for insulating circuit patterns of two layers is formed by screen printing using an insulating paste, in order to obtain a sufficient thickness (60 μm or more) of the insulating layer, printing must be performed three times or more. As a result, the number of steps and hence the cost are increased. In addition, since printing is performed a plurality of times, variations in layer thickness tend to occur and voids are easily generated. Therefore, reliability of interlayer insulation is insufficient. A silver paste is generally used as a conductive paste. However, if the silver paste is printed on an insulating paste, migration of silver tends to occur.

SUMMARY OF THE INVENTION

The present invention has been made to solve the above problems, and has as its object to provide a method of manufacturing a two-layer printed circuit sheet, in which an insulating layer can be obtained without screen printing, and the steps are simplified.

According to the present invention, there is provided a method of manufacturing a two-layer printed circuit sheet, comprising the steps of preparing an insulating sheet, on both surfaces of which circuit patterns are formed, the insulating sheet having a through hole formed therein in advance at a position where the circuit patterns are electrically connected to each other, forming a bottom of the through hole by attaching a releasable hole-bottom sheet to one of the surfaces of the insulating sheet, filling a conductive paste into the through hole from an open end thereof, printing a first-layer circuit pattern on the other surface of the insulating sheet to which the hole-bottom sheet is not attached, removing the hole bottom sheet, and printing a second-layer circuit pattern on the surface of the insulating sheet, from which the hole bottom sheet is removed.

According to the present invention, circuit patterns are printed on both the surfaces of the insulating sheet in this manner so that the thickness of the insulating layer can be made uniform. As a result, reliability of interlayer insulation can be increased, and the number of printing steps can be decreased. In addition, a through hole is formed in the insulating sheet in advance, and a hole bottom sheet is attached to one surface of the insulating sheet. Subsequently, a conductive paste is filled into the hole, and then the hole bottom sheet is removed. With this process, the through hole of the insulating sheet can be completely filled with the conductive paste, and hence the circuit patterns on both the surfaces can be reliably rendered conductive.

Note that either filling of the conductive paste into the hole or printing of the first-layer circuit pattern can be performed first upon attachment of the hole bottom sheet.

BRIEF DESCRIPTION OF THE DRAWINGS

FIGS. 1A to 1H are sectional views showing steps in a method of manufacturing a two-layer printed circuit board according to an embodiment of the present invention; and FIGS. 2A to 2H are sectional views showing steps in a method of manufacturing a two-layer printed circuit board according to another embodiment of the present invention.

DETAILED DESCRIPTION OF THE PREFERRED EMBODIMENTS

Embodiments of the present invention will be described in detail below with reference to the accompanying drawings.

Figure 1A:
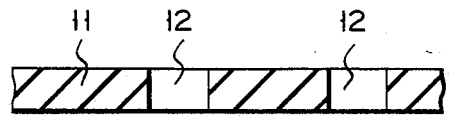

FIGS. 1A to 1H show steps in an embodiment of the present invention. As shown in FIG. 1A, insulating sheet 11 is prepared. Insulating sheet 11 has through holes 12 at positions for electrically connecting circuit patterns formed on its both surfaces. A resin film, such as a polyethylene terephthalate film or a polyimide film, having a thickness of about 50 μm is used as insulating film 11.

Figure 1B:
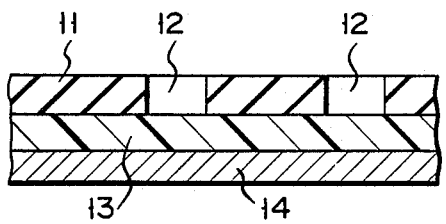

Subsequently, as shown in Fig. 1B, hole-bottom sheet 13 is attached to one surface of insulating sheet 11 so as to form hole bottoms. Hole-bottom sheet 13 is made of a water-soluble resin film. Hole-bottom sheet 13 is attached to reinforcing sheet 14 made of, for example, aluminum. For example, RISTON ® available from Du Pont de Nemours can be used as the water-soluble resin film constituting hole-bottom sheet 13.

Figure 1C:
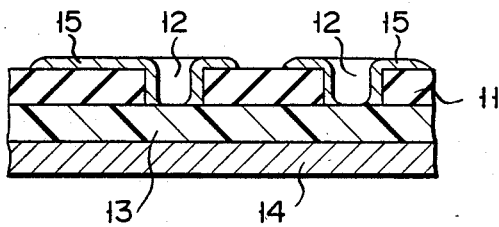
Figure 1D:
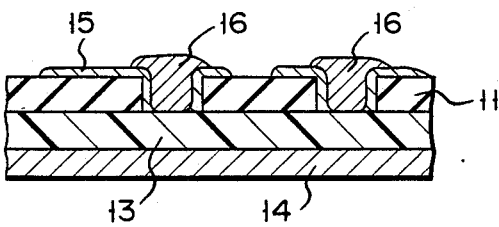

As shown in FIG. 1C, first-layer circuit pattern 15 is printed on the other surface of insulating sheet 11 by using a conductive paste containing a silver filler. Upon this printing, the conductive paste is dropped in holes 12. However, since holes 12 cannot be completely filled with the conductive paste by only this operation, conductive paste 16 is further printed for filling holes 12, as shown in FIG. 1D. The conductive paste for circuit pattern 15 may be used as hole-filling conductive paste 16. In this embodiment, however, since conductive pastes 16 in these holes are formed into pad portions for mounting parts, a conductive paste (land paste) allowing soldering is used.

Subsequently, as shown in FIG. 1E, solder resist 17 is printed except for the pad portions. As shown in FIG. 1F, release agent 18 for transferring circuit pattern is coated on the resultant structure, and carrier film 19 is then attached thereto. Thereafter, aluminum sheet 14 is peeled off, and water-soluble resin film 13 is removed by using an aqueous alkaline solution, thereby exposing insulating sheet 11.

The resultant structure is then turned upside down, and second-layer circuit pattern 20 is printed on exposed insulating sheet 11 by using a silver paste, as shown in FIG. 1G. Furthermore, as shown in FIG. 1H, adhesive agent 21 is coated on pattern 20. Adhesive agent 21 increases adherence between the printed circuit sheet manufactured in this manner and an injection molding resin to be integrally formed with the sheet.

With the above-described steps, a transfer sheet having circuit patterns of two layers is completed. This sheet is set in a die such that the adhesive agent 21 is brought into contact with the injection molding resin. When carrier film 19 is peeled off together with release agent 18 upon injection molding, an injection-molded body with which the two-layer printed circuit sheet is integrally formed can be obtained.

Figure 2E:
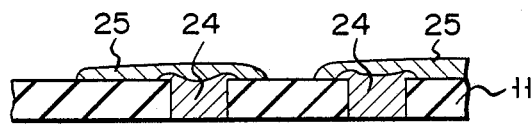

FIGS. 2A to 2H show another embodiment of the present invention. Similar to the above-described embodiment, insulating film 11 having through holes 12 formed therein at its predetermined positions is prepared, as shown in FIG. 2A. Thereafter, as shown in FIG. 2B, hole-bottom sheet 23 made of silicone rubber is attached to one surface of insulating sheet 11 so as to form hole bottoms. A sheet having such adherence as to allow the sheet to be easily peeled off later is used as sheet 23.

Subsequently, as shown in FIG. 2C, conductive paste 24 is filled into each hole 12 from the other surface of insulating sheet 11 by screen printing. In addition, first-layer circuit pattern 25 is printed on the resultant structure by using a conductive paste, as shown in FIG. 2D.

Figure 2F:
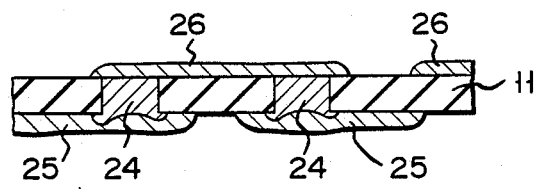
Figure 2G:
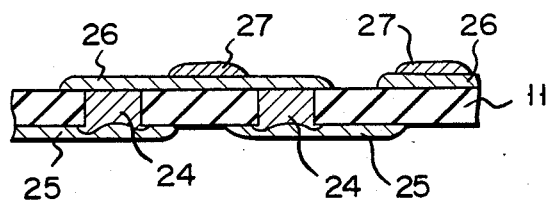
Figure 2H:
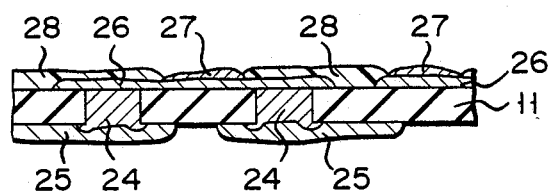

Sheet 23 is then peeled off to obtain a state shown in FIG. 2E. The resultant structure is turned upside down, and second-layer circuit pattern 26 is printed on insulating sheet 11 by using a conductive paste, as shown in FIG. 2F. As shown in FIG. 2G, conductive paste 27 allowing soldering is printed on part-mounting portions of second-layer circuit pattern 26, thereby forming pad portions. Thereafter, solder resist 28 is printed except for the pad portions, as shown in FIG. 2H.

With the above-described steps, a two-layer printed circuit sheet is completed. When this sheet is set in a die such that the first-layer circuit pattern 25 side is brought into contact with an injection molding resin, and injection molding is performed, an injection-molded body incorporating the two-layer printed circuit sheet can be obtained.

As has been described above, according to the present invention, since circuit patterns are printed on both the surfaces of an insulating sheet, the thickness of a insulating layer between the circuit patterns of the two layers can be made uniform, and the number of printing steps can be decreased. In addition, since through holes formed in an insulating sheet in advance can be completely filled with a conductive paste at conductive portions of the circuit patterns of the two layers by using a hole bottom sheet, a highly reliable conductive state can be obtained. Moreover, even if a silver paste is used as a conductive paste for a circuit pattern, since an interlayer insulating layer consists of an insulating sheet instead of a paste, occurrence of silver migration is suppressed.

Although a two-layer printed circuit sheet obtained by the manufacturing method of the present invention is suitable to be used integrally with an injection-molded body, its application is not limited to this. For example, similar to a general flexible printed circuit, this sheet can be independently used.

Note that the present invention is not limited to the above embodiments, and various changes and modifications can be made. For example, a polyethylene terephthalate film or the like is used as an insulating sheet in the embodiments. However, the present invention is not limited to this. In addition, a water-soluble resin film or silicone rubber is used as a hole-bottom sheet. Similarly, the present invention is not limited to this.

What is claimed is:

1. A method of manufacturing a two-layer printed circuit sheet, comprising the steps of:
    preparing an insulating sheet, on both surfaces of which circuit patterns are formed, said insulating sheet having a through hole formed therein in advance at a position where the circuit patterns are electrically connected to each other;
    forming a bottom of the through hole by attaching a releasable hole-bottom sheet to one of the surfaces of said insulating sheet;
    filling a conductive paste into the through hole from an open end thereof;
    printing a first-layer circuit pattern on the other surface of said insulating sheet to which said hole-bottom sheet is not attached;
    removing said hole-bottom sheet; and
    printing a second-layer circuit pattern on the surface of said insulating sheet, from which said hole-bottom sheet is removed.

2. A method according to claim 1, wherein said hole-bottom sheet comprises a water-soluble resin composition and is removed by dissolving said resin composition in water.

3. A method according to claim 1, wherein said hole-bottom sheet comprises an adherent sheet and is removed by peeling.

4. A method according to claim 1, wherein the step of filling said conductive paste into the through hole is performed after printing of said first-layer circuit pattern.

5. A method according to claim 1, wherein the step of filling said conductive paste into the through hole is performed before printing of said first-layer circuit pattern.

6. A method according to claim 1, wherein at least one of said first- and second-layer circuit patterns comprises a conductive paste allowing soldering.

7. A method according to claim 1, wherein said insulating sheet comprises a resin film.

8. A method according to claim 1, wherein said insulating sheet comprises a polyethylene terephthalate film.

9. A method according to claim 1, wherein said insulating sheet comprises a polyimide film.

* * * * *

UNITED STATES PATENT AND TRADEMARK OFFICE
CERTIFICATE OF CORRECTION

PATENT NO. : 4,908,940
DATED : March 20, 1990
INVENTOR(S) : AMANO et al It is certified that error appears in the above-identified patent and that said Letters Patent is hereby corrected as shown below:

IN THE TITLE PAGE:

Delete the Foreign Application Priority Data:

Jun. 22, 1987 (JP) Japan......62-153531

Under "References Cited", insert the following U.S. Patent Documents:

4,263,341  4/1981  Martyniak
3,385,773  5/1968  Frantzen

Insert the following under "FOREIGN PATENT DOCUMENTS":

2,163,007 A  2/1986  United Kingdom
2,296,988    7/1976  France
2,468,279    4/1981  France
A 61-74792   4/1986  Japan (Abstracts only)

Signed and Sealed this

Twenty-eighth Day of April, 1992

*Attest:*

HARRY F. MANBECK, JR.

*Attesting Officer*  *Commissioner of Patents and Trademarks*